United States Patent
James et al.

(10) Patent No.: US 6,906,936 B1
(45) Date of Patent: Jun. 14, 2005

(54) DATA PRECLASSIFIER METHOD AND APPARATUS FOR CONTENT ADDRESSABLE MEMORY (CAM) DEVICE

(75) Inventors: David V. James, Palo Alto, CA (US); Jagadeesan Rajamanickam, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 232 days.

(21) Appl. No.: 10/320,049

(22) Filed: Dec. 16, 2002

Related U.S. Application Data

(60) Provisional application No. 60/343,973, filed on Dec. 27, 2001.

(51) Int. Cl.[7] .............................................. G11C 15/00
(52) U.S. Cl. ..................................... 365/49; 365/189.07
(58) Field of Search ............................ 365/49, 189.07, 365/189.08, 189.12

(56) References Cited

U.S. PATENT DOCUMENTS

| | | | |
|---|---|---|---|
| 5,749,087 A | 5/1998 | Hoover et al. | |
| 6,700,889 B1 * | 3/2004 | Nun | 370/392 |
| 6,732,228 B1 * | 5/2004 | Willardson | 711/108 |
| 6,763,426 B1 * | 7/2004 | James et al. | 711/108 |
| 6,845,024 B1 * | 1/2005 | Wanzakhade et al. | 365/49 |

OTHER PUBLICATIONS

U.S. Appl. No. 10/217,746.
U.S. Appl. No. 10/180,357.

* cited by examiner

*Primary Examiner*—Richard Elms
*Assistant Examiner*—Hien Nguyen
(74) *Attorney, Agent, or Firm*—Bradley T. Sako

(57) ABSTRACT

A content addressable memory (CAM) device (100) may include a CAM array (102), a CAM array access circuit (104), and a preclassifier circuit (106). A preclassifier circuit (106) may selectively modify portions of an input data value before such an input data value is applied to a CAM array (102). In particular embodiments, a preclassifier circuit (106) may compare a compare portion of an input data value to one or more ranges. If such a portion falls within a range, a preclassifier may substitute a compare portion with a range code value to form a modified input data value.

17 Claims, 7 Drawing Sheets

| MODE_SUB | SIDE_B' | OUT MSK A | OUT MSK B | OUT DATA A | OUT DATA B |
|---|---|---|---|---|---|
| 0 | 0 | MSK A | MSK B | DATA A | DATA B |
| 1 | 0 | MSK A | 0 | DATA A | DATA A |
| 1 | 1 | 0 | MSK B | DATA A | DATA A |
FIG. 5
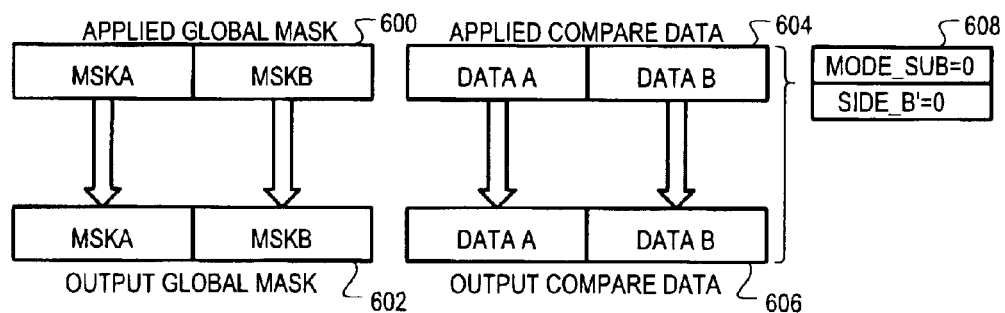
FIG. 6A
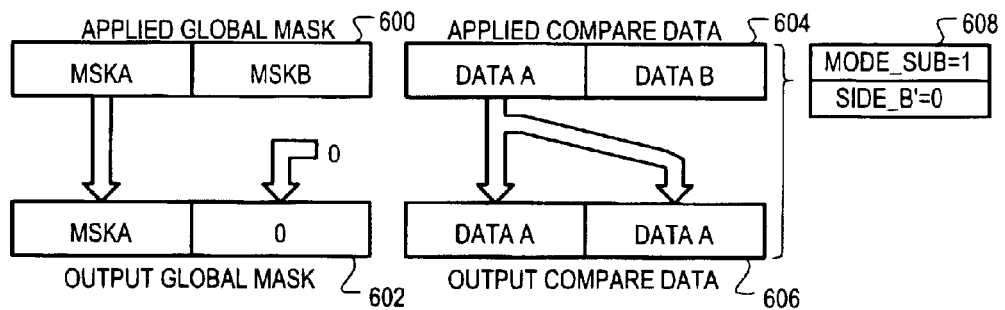
FIG. 6B
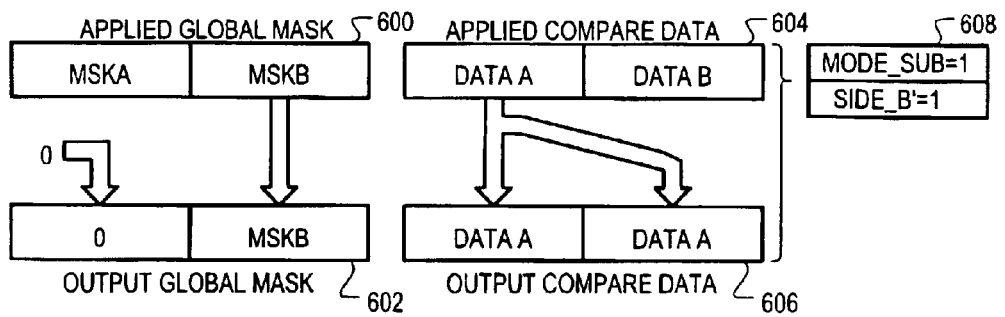
FIG. 6C

DATA PRECLASSIFIER METHOD AND APPARATUS FOR CONTENT ADDRESSABLE MEMORY (CAM) DEVICE

This application claims the benefit of provisional patent application Ser. No. 60/343,973 filed on Dec. 27, 2001.

TECHNICAL FIELD

The present invention relates generally to content addressable memory (CAM) devices, and more particularly to circuits that apply data values to CAM cell arrays, or the like.

BACKGROUND OF THE INVENTION

Content addressable memory (CAM) devices can be a common component of search engine systems. Search engine systems typically perform a search operation that can compare a search value (e.g., a comparand or key) against a number of other data values. In the event a search value matches a data value, a search result may be considered a "hit" (e.g., match). If a search value does not match any data values, a search result may be considered a "miss" (e.g., no match).

A CAM based search engine can typically include one or more CAM devices. A CAM device may include a number of entries, each of which may store a data value, or portion thereof In a search operation, a comparand (or key) may be compared to multiple entries to see if all, or a portion, of the key matches an entry. After a search operation, a CAM device may give a search result as an output. Typically a search result may provide associated data directly, or provide an "index" value that may be used to retrieve associated data from another device, such as a random access memory.

CAM devices may include a CAM array section (or CAM "core") that can take a various forms. As but a few of the possible examples, a CAM array section may be based on particular types of CAM cells. Such cells may include storage circuits integrated with compare circuits. Examples of storage circuits may be static random access memory (SRAM) type cells or dynamic random access memory (DRAM) type cells. Alternate approaches may include random access memories (RAM) arrays, or the like, with separate matching circuits and/or processing circuits.

Accordingly, a CAM array section may provide various functions, including but not limited to storing various data values for comparison with a search key value, receiving a search key value, and comparing a search key value to stored data values in order to generate match results. In addition, a CAM array section may provide maskable compare operations. In such an arrangement, a CAM array section may store or receive a mask value corresponding to a search key value. Such a mask value can enable selective comparison of search key values to stored data values by masking bits from a compare operation according to a mask value.

A conventional CAM device will now be described.

Referring now to FIG. 9, a conventional CAM device is set forth in a block diagram and designated by the general reference character 900. A conventional CAM device 900 may include a CAM array section 902 that includes a number of CAM entries (ENTRY0 to ENTRYn). Each entry (ENTRY0 to ENTRYn) may store a data value for comparison with an applied key value KEY. A data value stored in an entry (ENTRY0 to ENTRYn) can have a predetermined width, shown as W.

Thus, in a compare operation, a search key value of size W may be compared to data values of size W stored within entries (ENTRY0 to ENTRYn). In such an operation, an entire array can be activated, with each CAM entry consuming power. Further, in conventional ternary CAM operations, CAM entries (ENTRY0 to ENTRYn) can provide bit-wise masking on an entry-by-entry basis. Thus, each CAM entry (FNTRYO to ENTRYn) can be conceptualized as including a data value and a mask value. For example, each conventional ternary CAM entry may include a data value of W bits and a corresponding mask value of W bits.

Examples of a conventional CAM system will now be described.

A conventional CAM system is set forth in FIG. 10 and designated by the general reference character 1000. A conventional CAM system 1000 may include a number of CAM devices (1002-0 to 1002-3) having common connections to a command and data bus 1004, as well as separate common connections to an index or result bus 1006. Optionally, an index or result bus 1006 may be connected to one or more memory devices 1008, such as a static random access memory (SRAM).

In a system like that shown in FIG. 10, a search command may be issued from a host device 1010 on a command and data bus 1004. Such a search command may include a search key of a predetermined size (e.g., W bits). CAM devices (1002-0 to 1002-3) may process such a command by comparing a search key of W bits to data values of a same size (W bits). Search results may be output on an index or result bus 1006. In this way, utilization of CAM devices (1002-0 to 1002-3) can enable compare operations for search keys of size W to be "offloaded" from a processor (e.g., host device 1010) to CAM devices (1002-0 to 1002-3). This may allow for faster or higher throughput search results, as CAM devices (1002-0 to 1002-3) may typically execute such compare operations at a much faster rate than a general purpose processor.

While a search engine system 1000 may provide for rapid compare operations relative to general processor based systems, it may be desirable to provide different or additional features in such a system.

One desirable feature can be searching according to "sub-word" sizes. That is, if CAM entries may store data values of size W, it may be desirable to also offer the ability to compare search keys of a smaller size (e.g., ½W) to data values of a corresponding size. Of course, it is understood that the term "word" is not meant to correspond to a particular bit size, but rather to reflect an entry size of a CAM device.

Sub-word size compare operations may be accomplished in ternary CAM devices by including sub-word mask values. Such an arrangement can be a waste of storage space, however.

Another conventional approach to accommodate sub-word sizes has included offloading such operations to a general purpose processor, or the like (e.g., a host). As but one example, a host may perform a hashing function on smaller search key sizes, to thereby generate an address for associated data. A drawback to utilizing a host for hashing smaller size search values is that such an approach works against overall system performance. As noted above, a search engine system may include CAM devices in order to offload such computing requirements from a host, or the like. Thus, requiring a host to hash smaller size search keys undesirably consumes host resources, which can reduce overall search speeds and/or rates.

Another desirable feature of a search engine system can be range matching. In many applications, such as network applications, it can be desirable to determine if a value in a particular data packet field falls within a predetermined range. In a conventional approach, a small range match could be accommodated by a corresponding range of entries. That is, CAM entries could be programmed with each value in a given range. Unfortunately, for larger ranges such an approach may be impractical, as a range could consume too many entries.

An alternative way of accommodating range matching can include offloading such operations to a host, or the like. An algorithm executed by a host could then extract a desired data field from a packet, and then compare particular packet values to high and low ranges. An indication may then be generated if a value is within a given range. A drawback to such an approach can be the undesirable load placed on a host.

Another way to provide range matching can include a novel CAM device that provides range matching capabilities on a per entry basis. One such approach is disclosed in commonly owned, co-pending U.S. patent application Ser. No. 10/217,746, filed on Aug. 13, 2002, entitled "CONTENT ADDRESSABLE MEMORY (CAM) DEVICE WITH ENTRIES HAVING TERNARY MATCH AND RANGE COMPARE FUNCTIONS" by Richard K. Chou. The contents of this application are incorporated herein.

While per entry range matching may provide desirable capabilities in some applications, in other applications range matching may only represent a smaller portion of all compare operations. Thus, for such applications, per entry range matching may underutilize range matching capabilities.

It is always desirable to arrive at some way of reducing the power consumed by an integrated circuit, such as a CAM device. Various approaches to reducing power consumption in a CAM device have been proposed. One conventional power reduction approach may include comparing a small portion of a data value to a corresponding portion of a search key value. A comparison for a remaining larger portion of a data value may then be conditioned on the compare results of a first portion. While such an approach may provide for some power savings, it may be desirable to realize even more power savings.

It would also be desirable to arrive at some way providing range matching capabilities in a search engine system that does not necessarily rely on per entry range matching.

In light of the above, it would be desirable to arrive at some way providing sub-word matching capabilities in a search engine system that does not undesirable add to computing tasks of a host.

SUMMARY OF THE INVENTION

According to the present invention, a content addressable memory (CAM) device may include a data preclassifier circuit that receives an input data value. A data preclassifier circuit can include one or more range compare circuits that can compare a portion of an input data value to one or more predetermined ranges to generate a compare result value. A data preclassifier may also include a merge circuit that can substitute a compare result value for a portion of the input data value to form a modified data value.

According to one aspect of the embodiments, an input data value for a CAM device may be selected from the group that includes an entry data value for storage in a CAM entry, a search key value for comparison with entry data values, and a mask value for masking selected bits from a compare operation between a search key value and entry data values.

According to another aspect of the embodiments, a CAM device may also include a mask register that provides mask values. Such mask values may be input data values that are modified by a data preclassifier circuit to form modified data values.

According to another aspect of the embodiments, a CAM device may also include one or more range registers that can store a predetermined range for comparison with a portion of an input data value.

According to another aspect of the embodiments, a CAM device may also include a preclassifier bypass circuit that outputs an input data value when a target match signal has a first value and outputs a modified data value when a target match signal has a second value.

According to another aspect of the embodiments, a CAM device may also include a compare circuit that compares an input target value to at least one CAM device target value to generate a target match signal. Such a target match signal can result in a data preclassifier circuit being bypassed.

According to another aspect of the embodiments, a CAM device may include a number of range compare circuits that each compares a received input data value portion to a predetermined range to generate single range compare result value. According to another aspect of the embodiments, a CAM device may also include a range priority encoder that prioritizes single range compare result values. A range priority encoder may also encode a highest prioritized range compare result value to generate the compare result value.

According to another aspect of the embodiments, a CAM device may include a merge circuit with a merge shift circuit and a combine circuit. A merge shift circuit can shift an encoded compare result value according to a shift value to generate a shifted encoded compare result. A combine circuit can logically combines a shifted encoded compare result value with an input data value to form a modified data value.

According to another aspect of the embodiments, a range compare circuit can include an input select circuit that selects a portion of the input data value.

According to another aspect of the embodiments, a data value can include a mask value, and a CAM device may include a first mask output circuit that outputs a received first mask value portion in a first mode and predetermined mask value in a second mode.

According to another aspect of the embodiments, an input data value can include a mask value, and a data preclassifier circuit can provide an output mask value. A second mask output circuit can output a received second mask value portion in a first mode and the predetermined mask value in a second mode.

According to another aspect of the embodiments, an input data value can include a compare data value, and a data preclassifier circuit can provide an output compare data value. A data output circuit can output a second portion of the output compare data value in a first mode and output a first portion of the output compare data value in a second mode.

The present invention may also include a method of modifying an input data value for application to a CAM device array. The method may include generating a range match result if a predetermined portion of a data value is within at least one predetermined range, encoding a range match result to generate a range code, and substituting at least a portion of the range code value for a portion of the input data value to generate a modified data value.

According to one aspect of the embodiments, a method may also include comparing the predetermined portion of the data value to a number of ranges to generate a number of match results. Such match results may then be prioritized to select a single match result.

According to another aspect of the embodiments, a method may also include applying a modified data value to a CAM device array.

The present invention may also include a CAM that includes a CAM core and a circuit. Such a circuit may classify an incoming search key according to predetermined criteria, modify the incoming search key based on the predetermined criteria, and issue the modified search key to a CAM core.

According to another aspect of the embodiments, a CAM circuit can classify an incoming search key based on a comparison of at least a portion of the search key with at least one predetermined range.

According to another aspect of the embodiments, a CAM circuit can classify an incoming search key by generating an encoded value, and can modify an incoming search key by altering a portion of the search key according to the encoded value.

According to another aspect of the embodiments, a CAM may also include a target match circuit that compares a search target value to at least one CAM device target value to generate a target match indication. A CAM circuit may then selectively classify an incoming search key according to the target match indication.

BRIEF DESCRIPTION OF THE DRAWINGS

FIG. 5 is a table showing the operation of the CAM device of FIG. 4.

FIGS. 6A to 6C are block diagrams showing the operation of the CAM device of FIG. 4.

DETAILED DESCRIPTION OF THE EMBODIMENTS

Various embodiments will now be described in conjunction with a number of diagrams. The embodiments show various examples of a circuit that may classify incoming data prior to applying such data to a CAM array.

Figure 1:
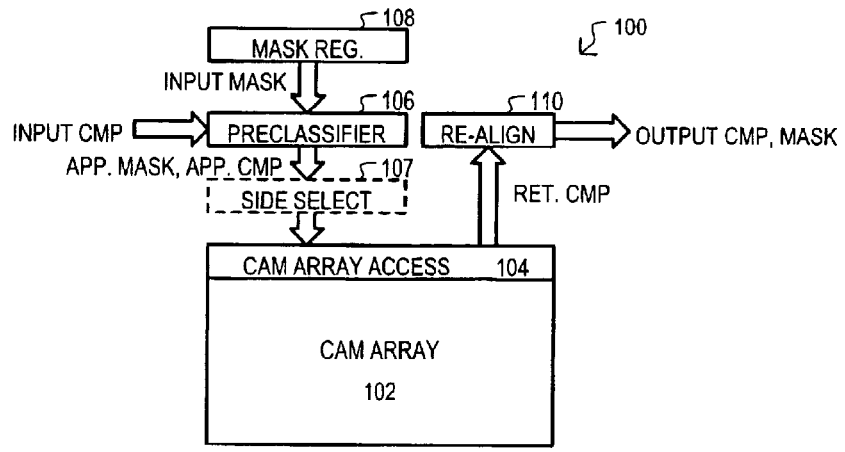
FIG. 1 is a block schematic diagram of a content addressable memory (CAM) device according to one embodiment of the present invention.

Referring now to FIG. 1, a block diagram of a content addressable memory (CAM) device is set forth in a block schematic diagram, and designated by the general reference character 100. A CAM device 100 may include a CAM array 102 and a CAM array access circuit 104. A CAM array 102 may include a number of CAM entries for storing data values for comparison with an applied CAM search key value. Such CAM array entries may provide "binary" matching capabilities or "ternary" matching capabilities.

A CAM array access circuit 104 may apply selected data values to a CAM array 102 (or CAM "core") and/or retrieve selected data values from a CAM array 102. Data values applied or issued to CAM array 102 may include compare data values and mask values. Compare data values may include search key values and/or data values to be stored in a CAM entry of CAM array 102. For example, in a search operation, a compare data value may include a search key that is to be compared to data values of CAM entries. In a write operation, a compare data value may include a data value to be written into CAM array 102. In a read operation, a compare data value may include a data value read from CAM array 102. Mask values may be "global" mask values. Such global mask values may mask selected bits from a compare operation for all valid CAM entries of CAM array 102.

Unlike a conventional CAM device, a CAM device 100 according to FIG. 1 may also include preclassifier circuit 106. A preclassifier circuit 106 may receive input data values and generate applied data values. In the very particular example of FIG. 1, input data values for a preclassifier circuit 106 may include an input compare value INPUT CMP and an input mask value INPUT MASK. In response to an input compare value INPUT CMP, a preclassifier circuit 106 may output an applied compare value APP. CMP. Similarly, in response to an input mask value INPUT MASK, a preclassifier circuit 106 may output an applied mask value APP. MASK.

A preclassifier circuit 106 may selectively modify portions of an input data value before such a data value is applied to a CAM array 102. As will be described in more detail below, such modified data can enable range matching and/or sub-word compare operations and/or power reduction in compare operations.

A CAM device may also include a side selection circuit 107. A side selection circuit 107 can be conceptualized as part of a preclassifier circuit 106, and can enable sub-word compare operations.

In the particular example of FIG. 1, input mask values (INPUT MASK) can be provided by a mask register 108. In this way, global mask values may be stored in a mask register 108 and retrieved from such a register for use in compare operations.

A CAM device 100 may also include a re-aligning circuit 110. A re-aligning circuit 110 may receive retrieved data values from a CAM array 102, and provide such data as output data values. Retrieved data values may include retrieved compare data values RET. CMP, which can include data values read from CAM entries. A re-aligning circuit 110 can shift or otherwise modify data retrieved from a CAM array 102. As but one example, a preclassifier circuit 106 may add or alter data fields of an input data value, to generate a corresponding data value for storage in a CAM array 102. A re-aligning circuit 110 may reverse such changes to provide an output data value (OUTPUT CMP) that corresponds to an originally received input value (INPUT CMP).

Figure 2:
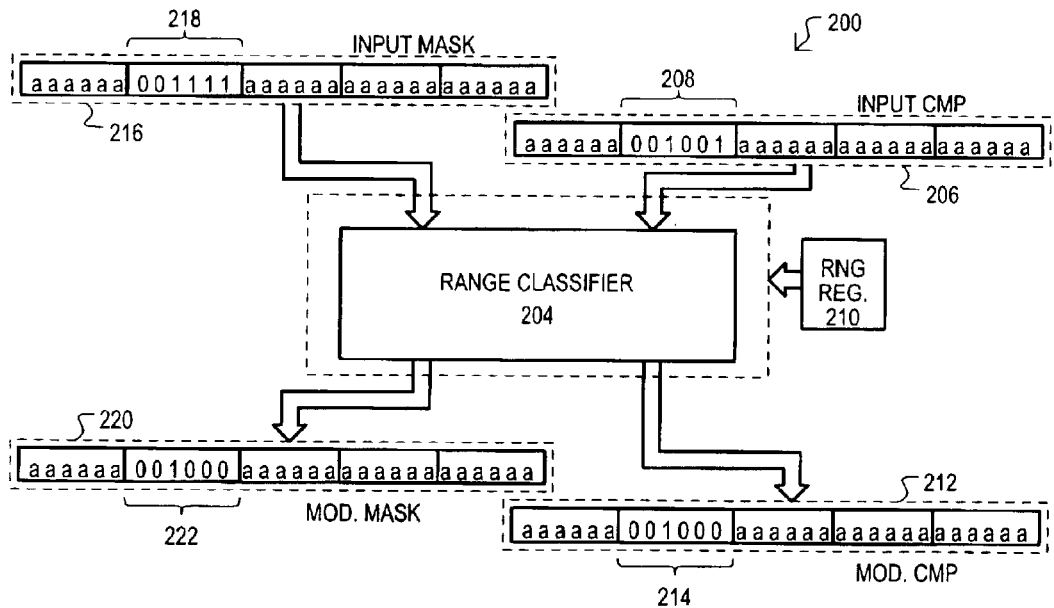
FIG. 2 block diagram showing a preclassifier circuit operation according to an embodiment of the present invention.

Referring now to FIG. 2, one example of a preclassifier circuit operation is set forth in a block schematic diagram and designated by the general reference character 200. FIG.

2 shows a preclassifier circuit 202 that may include a range classifier 204. A range classifier 204 may receive input data values and compare portions of such values to one or more predetermined ranges. According to the results of such a comparison, a preclassifier circuit may generate applied data values.

In this way, input data, which can include an input search key, may be classified according to whether or not a selected portion falls within one or more predetermined ranges.

In the very particular example of FIG. 2, a range classifier 204 may receive an input compare data value 206. A range compare portion 208 of input compare data value 206 can be compared to ranges stored in a range register 210. If a compare portion 208 falls within a range, a range classifier 204 may substitute a compare portion 208 with a corresponding range code to generate a modified compare data value 212.

Figure 3:
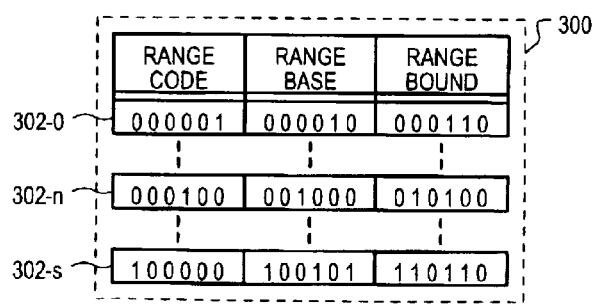
FIG. 3 is a table showing one example of a range register for the operation shown in FIG. 2.

FIG. 3 is a table showing one example of values that can be stored in a range register 300. FIG. 3 shows three sample ranges 302-0, 302-n and 302-s. Each range can be defined by a lower limit RANGE BASE and an upper limit RANGE BOUND. Further, each range can have an associated code RANGE CODE. According to one arrangement, in the event a compare portion (e.g., 208) falls within a range, a range classifier (e.g., 204) can substitute a corresponding code RANGE CODE for such a compare portion, and thereby generate a modified compare data value.

Thus, referring to FIG. 2 in conjunction with FIG. 3, a compare portion 208 of compare data value 206 has a value "001001". Assuming a left-most bit is a most significant bit in the figures, a compare portion 208 has a value falling within a range 302-n. As a result, a range classifier 204 may substitute a range code "001000" for such a compare portion 208 to thereby produce modified compare data value 212 with a modified portion 214. In this way, a compare data value may be classified according to whether or not a predetermined portion of the compare data value falls within a particular range.

It is understood that a modified compare data value 212 may subsequently be applied as a search key or the like. In addition or alternatively, such a modified data value 212 may be written into a CAM entry.

Thus, according to the above embodiments, a match result in a CAM entry or core may represent a range match. In this way, range matching may be advantageously executed in a CAM device. This is in contrast to conventional approaches that may rely on a host device to determine such range matching.

The example of FIG. 2 illustrates an arrangement in which a global key value may be modified in the same general fashion as a corresponding compare data value. Thus, FIG. 2 also shows a global mask value 216 that includes a mask range portion 218. A range classifier 204 may substitute a mask range portion 218 with a same range code as a corresponding a modified data value 212.

Thus, referring to FIG. 2 in conjunction with FIG. 3, a mask range portion 218 of global mask value 216 has a value "001111". A range classifier 204 may substitute a range code "001000" for such a mask range portion 208 to thereby produce modified mask value 220 with a modified mask portion 222. In this way, a global mask value may be modified to correspond with a modified compare data value.

Of course, while FIGS. 2 and 3 have illustrated six bit ranges, such a particular bit value is provided as but one example. Smaller or larger bit value ranges may he compared.

It is noted that an arrangement like that illustrated in FIGS. 2 and 3 may allow for the formulation of "rule" based searches that take advantage of range classification. For example, ranges, like those shown as 302-0 to 302-s in FIG. 3 may represent mutually exclusive ranges. Further, a one of the ranges (e.g., a last range) may represent an "outside" range value. In this way, as compare data values are stored within a CAM-type device, such compare data values may be written to correspond to one or more ranges. In the event a compare data value falls outside any predetermined range, such a value can be assigned the "outside" range value. It is understood that in such an arrangement, a write operation may be performed corresponding to each range that a compare value falls within. Such a preclassification of compare data values can allow range compare operations to be executed across multiple possible ranges with a single CAM search operation. This is in sharp contrast to conventional general-purpose processor based approaches that can include multiple algorithm steps.

Figure 4:
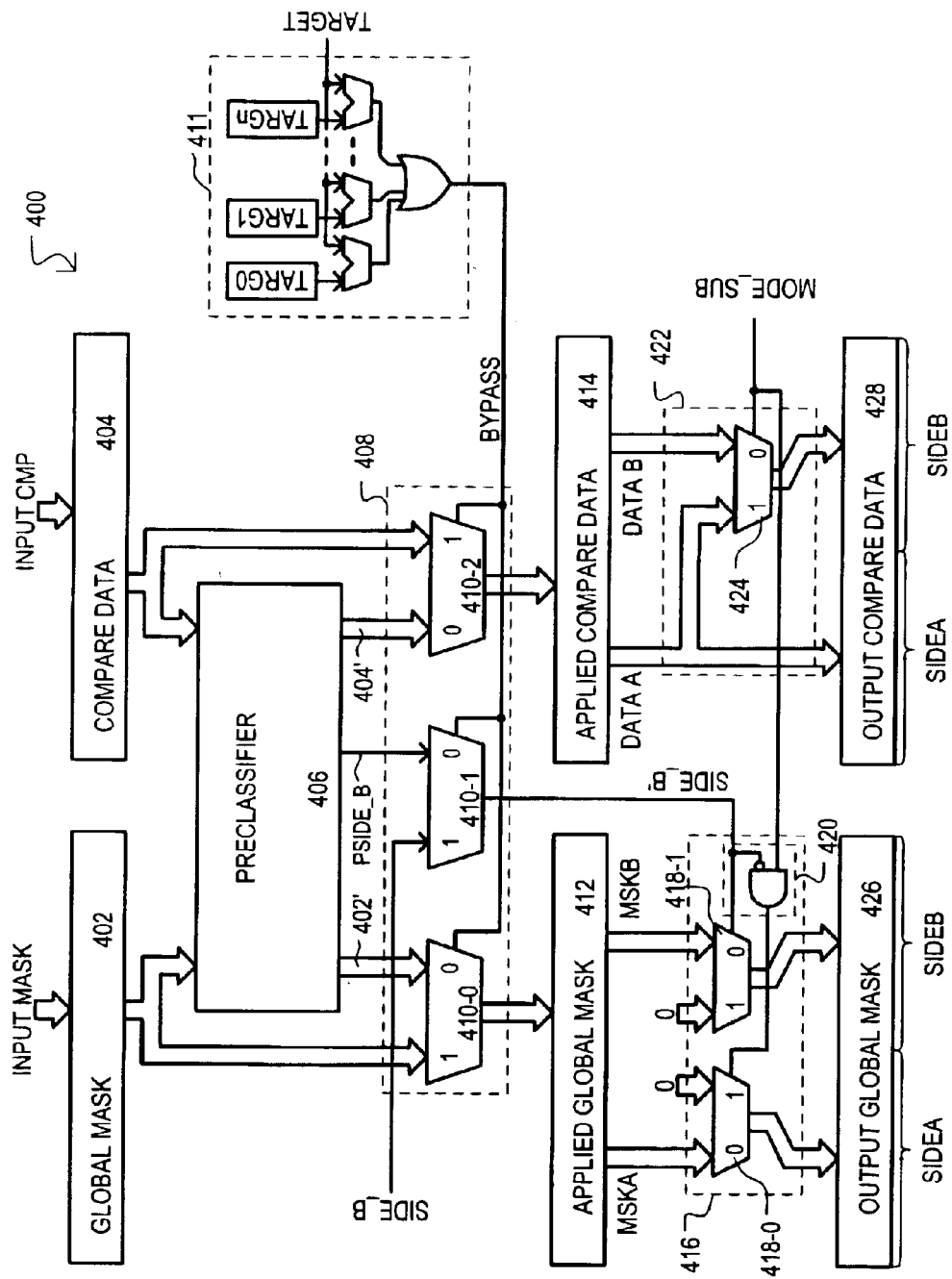
FIG. 4 is a block schematic diagram of a CAM device according to another embodiment of the present invention.

Another embodiment of a CAM device according to the present invention is set forth in FIG. 4, and designated by the general reference character 400. In addition to preclassifying compare and/or mask values, the embodiment of FIG. 4 may also provide "sub-word" matching. More particularly, a CAM device 400 may provide matching between one of two portions of CAM entries in a CAM device. Such portions are referred to in FIG. 4 as a "SIDEA" and a "SIDEB". In one very particular approach, a CAM device 400 may include 72-bit entries, and a SIDEA may be a first 36-bits of each entry, while a SIDEB may be a last 36-bits of an entry.

Still further, the embodiment of FIG. 4 may also allow for the selective bypassing of a preclassifier circuit. Thus, a CAM device 400 can be used for both range matching and conventional CAM entry matching.

A CAM device 400 may include a global mask value 402 and compare data value 404. A global mask value 402 can be like that shown as item 216 in FIG. 2. Similarly, a compare data value 404 can be like that shown as item 206 in FIG. 2.

A global mask value 402 and compare data value 404 can be provided to a preclassifier circuit 406 and a bypass circuit 408. A preclassifier circuit 406 can modify a compare data value 404 to generate a modified compare data value 404'. A preclassifier circuit 406 may also modify a global mask value 402 to generate a modified mask value 402'.

A bypass circuit 408 may enable a preclassifier circuit 406 to be bypassed. Thus, when a bypass signal BYPASS is active (high in this example), a bypass circuit 408 may output a global mask value 402 and compare data value 404 (e.g., output data not modified according to preclassifying criteria). However, when a bypass signal BYPASS is inactive (low in this example), a bypass circuit 408 may output a modified mask value 402' and modified compare data value 404' (e.g., data modified according to preclassifying criteria, such a range matching).

A bypass circuit 408 may also receive side selection signal SIDE_B. A side selection signal SIDE_B may determine which portion of CAM entries are subject to a compare operation in a sub-word compare mode.

The particular bypass circuit 408 shown in FIG. 4 includes a number of multiplexers 410-0 to 410-2. A multiplexer 410-0 may selectively output either a global mask value 402 or a modified mask value 402' according to a bypass signal BYPASS. A multiplexer 410-1 may selectively output either a side selection signal SIDE_B or a preclassifier side selection signal PSIDE_B according to a bypass signal BYPASS. A multiplexer 410-2 may selectively output either a compare data value 404 or a modified compare data value 404' according to a bypass signal BYPASS.

While a bypass signal BYPASS may be generated in a variety of ways, in the particular embodiment of FIG. 4, a bypass signal BYPASS may be generated according to a comparison between a command target value TARGET, and one or more device target values TARG0 to TARGn. A command target value TARGET may be a value included in a search command, or the like. More particularly, a search command may be received in a packet format, and include a target field with a command target value TARGET. Device target values (TARG0 to TARGn) may be values stored in a CAM device. As but one example, device target values (TARG0 to TARGn) may be programmable.

Thus, referring still to FIG. 4, a CAM device 400 may include a compare circuit 411 that can compare a command target value TARGET to one or more predetermined device target values (TARG0 to TARGN). If a command target value TARGET matches any of the device target values (TARG0 to TARGn) a bypass signal BYPASS may be activated. However, if a command target value TARGET does not match any device target values (TARG0 to TARGn) a bypass signal BYPASS may be inactive.

Of course, generation of a bypass signal BYPASS may occur in an opposite fashion. That is, if a command target value TARGET does not match any device target values (TARG0 to TARGn) a bypass signal BYPASS may active, and vice versa.

A mask value (e.g., global mask value or modified mask value) provided by a bypass circuit 408 may be considered an applied global mask value 412. Similarly, a data value (a compare data value or modified compare data value) provided by a bypass circuit 408 may be considered an applied compare data value 414. A bypass circuit 408 may also provide side select signal SIDE_B', selected from side select signal SIDE_B or preclassifier side select signal PSIDE_B.

An applied mask value 412 may have at least two portions, shown as MSKA and MSKB. Such portions can correspond to CAM entry portions (SIDEA and SIDEB).

An applied mask value 412 can be provided to a mask output circuit 416. A mask output circuit 416 can selectively mask sub-word portions of an applied global mask value. In the particular case of FIG. 4, a mask output circuit 416 may selectively mask a first portion (e.g., SIDEA) or a second portion (e.g., SIDEB), or neither. Such a selective masking may occur according to a side selection signal SIDE_B' and a sub-word mode signal MODE_SUB.

The very particular mask output circuit 416 of FIG. 4 can include a first side multiplexer (MUX) 418-0, second side (MUX) 418-1, and control logic 420. A first MUX 418-0 may selectively output a first portion of an applied mask value MSKA or a predetermined mask value ("0"). A predetermined mask value of "0" can represent bit values that are all 0. That is, if a first portion of a CAM entry (a Side A) was 36-bits, a predetermined mask value of 0 would be all 36-bits of zero. Similarly, a second MUX 418-1 may selectively output a second portion of an applied mask value MSKB or a predetermined mask value ("0"). Control logic 420 may generate control signals for first and second side MUXs (418-0 and 418-1).

In this way, a mask output circuit 416 may provide for selective masking of CAM entries in a compare operation.

An applied compare data value 414 may have at least two portions, shown as DATA A and DATA B. Data value portions (DATA A and DATA B) can correspond to CAM entry portions (SIDEA and SIDEB).

An applied compare data value 414 can be provided to a data output circuit 422. A data output circuit 422 can selectively output either two identical sub-word portions (DATA A/DATA A) of a full word value (DATA A/DATA B). Such a selective output of data may occur according to a sub-word mode signal MODE_SUB.

The very particular data output circuit 422 of FIG. 4 can include a sub-word MUX 424. A sub-word MUX 424 may selectively output a first portion of an applied compare data value DATA A or a second portion of an applied compare data value DATA B according to a sub-word mode signal MODE_SUB.

A resulting mask value provided by a mask output circuit 416 is shown in FIG. 4 as output global mask value 426. A resulting data value provided by data output circuit 422 is shown in FIG. 4 as an output compare data value 428.

It is understood that an output compare data value 428 may be provided as a search key to a CAM array in a search operation, or as a data value to a CAM array in a write operation. It is noted that by providing a same data value (DATA A) to both sides (SIDEA and SIDEB) of an output compare data value 428, a CAM device 400 can provide sub-word matching operations.

Similarly, an output global mask value 426 may be applied to a CAM array in a search operation. Also, as would be understood from the figure, in a sub-word matching operation, mask output circuit 416 may mask one side (SIDEA) or the other side (SIDEB) of corresponding CAM entries.

It is understood that mask output circuit 416 and data output circuit 422 may collectively form a side select circuit, like that shown as 107 in FIG. 1.

Referring now to FIG. 5, a table is set forth showing the operation of a CAM device like that shown in FIG. 4. FIG. 5 includes a column MODE_SUB which can represent a sub-word mode signal value, a column SIDE_B' which can represent a side selection value. Two portions of an output global mask value are shown by columns OUT MSK A and OUT MSK B. Similarly, two portions of an output compare data value are shown by columns OUT DATA A and OUT DATA B.

Referring still to FIGS. 4 and 5, it is understood that in a sub-word mode (e.g., MODE_SUB high) a same sub-word sized data value (DATA A) may be applied as both sides of an output data value (SIDEA and SIDEB). This can allow for faster search results than conventional approaches that may utilize a first search operation to apply a sub-word sized search key value to one portion of CAM data values, and then apply the sub-word sized search key value to another portion of CAM data values with a second, separate, search operation.

FIGS. 6A to 6C are block diagrams showing the CAM operation illustrated by FIG. 5. FIGS. 6A to 6C show an applied mask value 600 having two portions MSKA and MSKB and an applied compare data value 604 having two portions, DATA A and DATA B. FIGS. 6A to 6C also show an output global mask value 602 and output compare data value 606 that can result from a particular sub-word mode signal MODE_SUB and side selection signal. FIGS. 6A to 6C also show values for a sub-word mode signal MODE_SUB and side selection signal SIDE_B'.

Referring now to FIG. 5 in conjunction with FIG. 6A, an example of a "full word" mode of operation is shown. A full word mode of operation may occur when a sub-word mode signal MODE_SUB is inactive (low) and a side selection signal SIDE_B' is inactive (low). In such a full word mode of operation, an output compare data value 606 may be essentially the same as an applied compare data value 604. Thus, an output compare data value 606 may include both a first data portion DATA A and a second data portion DATA B. Similarly, an output global mask value can include both a first mask portion MSKA and a second mask portion MSKB.Referring now to FIG. 5 in conjunction with FIG. 6B, an example of a first sub-word mode of operation is shown. A first sub-word mode of operation may occur when a sub-word mode signal MODE_SUB is active (high) and a side selection signal SIDE_B' is inactive (low). In such a first sub-word mode of operation, an output compare data value 606 may include a first data portion DATA A provided as both parts of an output compare data value 606. An output global mask value can be provided that can mask one portion of an output compare data value. Thus, an output global mask value may have a first mask portion MSKA, however a second portion may be a mask "0" which can mask an entire second portion of CAM entry values from a compare operation.

Referring now to FIG. 5 in conjunction with FIG. 6C, an example of a second sub-word mode of operation is shown. A second sub-word mode of operation may occur when a sub-word mode signal MODE_SUB is active (high) and a side selection signal SIDE_B' is active (high). A second sub-word mode of operation can be like a first sub-word mode of operation, however, an opposite portion of CAM entry values can be masked. Thus, as shown in FIG. 6C, a first data portion DATA A can be provided as both parts of an output compare data value 606. However, an output global mask value can have a first mask portion of "0", while a second mask portion can be a value MSKB, derived from an applied global mask value.

In this way, a CAM device may selectively provide preclassification and/or provide sub-word matching operations.

Having described various arrangements of CAM device that may include a preclassification circuit, one very particular example of a preclassification circuit will now be described with reference to FIGS. 7A and 7B.

Figure 7A:
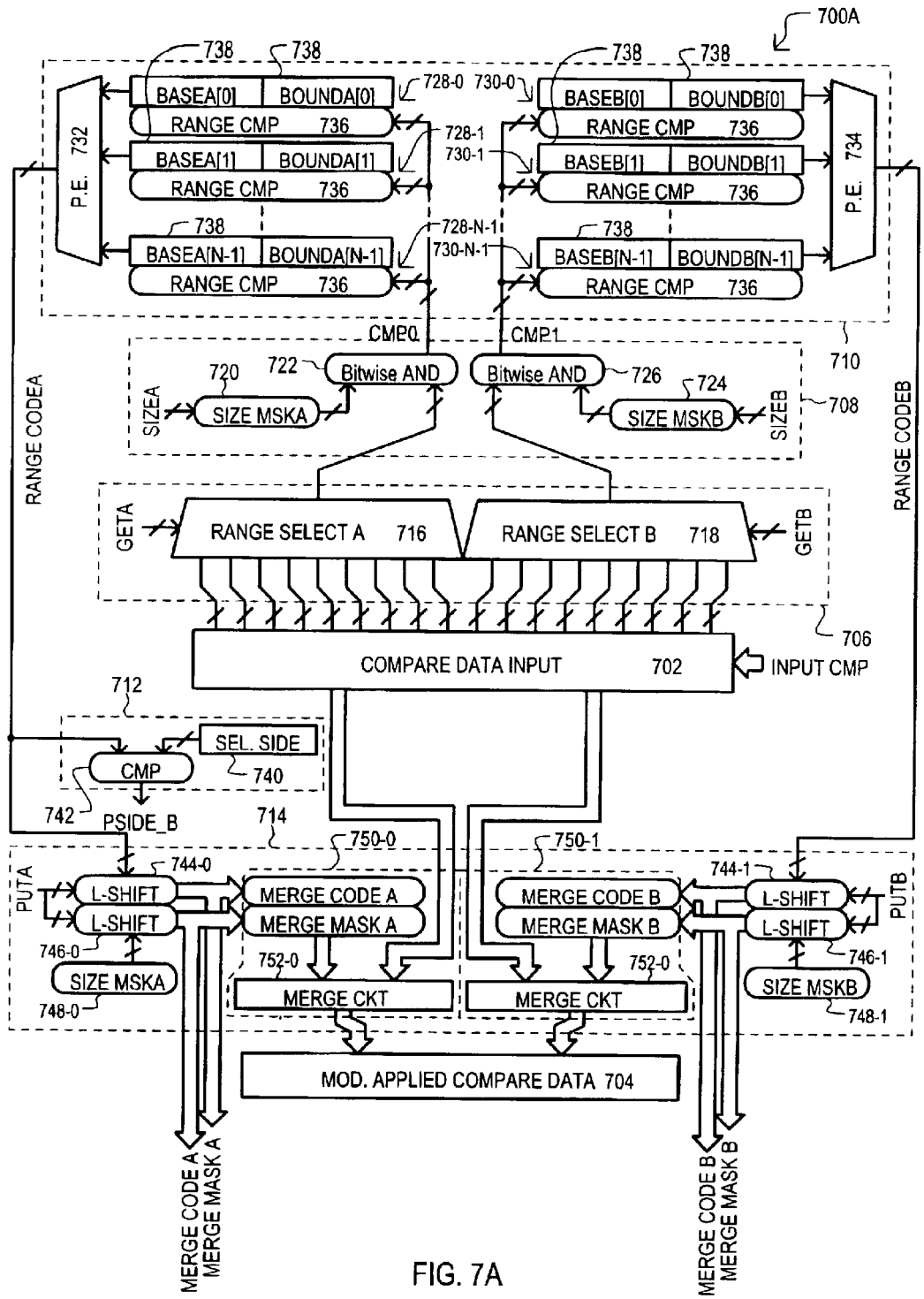
FIG. 7A is a block schematic diagram of a first section of a preclassifier circuit according to one embodiment.

FIG. 7A is a block schematic diagram showing a first section of a preclassifier circuit 700A. A first section 700A may receive a compare data value 702 and provide modified compare data value 704. A first section 700A may include a compare selection circuit 706, a selection mask circuit 708, a range compare circuit 710, a sub-word enable circuit 712, and a merge circuit 714.

A compare selection circuit 706 may extract one or more portions of a compare data value for comparison with a number of ranges. The particular compare selection circuit 706 of FIG. 7A may include a first select MUX 716 and a second select MUX 718. A first select MUX 716 may select a portion of a compare data value according to a first select value GETA. Similarly, a second select MUX 718 may select a portion of a compare data value according to a second select value GETB. As but one very particular approach, first and/or second select MUXs (716 and/or 718) can select from among different 16 bit ranges of a compare data input value that may include up to 144 bits.

First and second select values GETA and GETB may be generated by command supplied data values, or can be set by hardware parameters within a CAM device.

A selection mask circuit 708 may mask a retrieved portion of input compare data to generate a compare portion that can be supplied to a range compare section 710. In the very particular example of FIG. 7A, a selection mask circuit may include a first mask generator 720, first bitwise AND circuit 722, a second mask generator 724, and a second bitwise AND circuit 726. A first mask generator 720 may provide a mask value. Such a mask value may be bitwise "ANDed" within bitwise AND circuit 722 with a retrieved portion output from first select MUX 716. Such an operation can eliminate unwanted sections of a retrieved portion.

As but one very particular example, a first mask generator 720 may include a circuit that initially includes a 16-bit value, in which all bit values are 0. Value of "1" can be shifted to bit locations in a leftward direction according to a size indication SIZEA. Thus, if a size indication SIZEA was 8, a resulting mask value could be 00000000 11111111. Such a mask value could exclude the eight-most significant bits from a range compare operation, when ANDed with a retrieved portion from first select MUX 716.

Second mask generator 724 and second bitwise AND circuit 726 can operate in the same general fashion to produce a compare portion for a range compare section 710.

In this way, a selection mask circuit 708 may provide a first compare portion CMP0 and a second compare portion CMP1 extracted from a compare input value.

Size values SIZEA and SIZEB may be generated by command supplied data values, or can be set by hardware parameters within a CAM device.

A range compare section 710 may receive one or more compare portions extracted from an input compare data value, and generate range code values if such portions fall within one or more predetermined ranges. The particular range compare section 710 of FIG. 7A can include a number of first range compare circuits 728-0 to 728-N-1, a number of second range compare circuits 730-0 to 730-N-1, a first priority encoder 732, and a second priority encoder 734.

Each first and second range compare circuit (728-0 to 728-N-1 and 730-0 to 730-N-1) may include a range comparator 736 and range registers 738. A range comparator 736 may receive a compare portion (CMP0 or CMP1) and determine if such a compare portion falls within a range indicated by its corresponding range registers 738. If a compare portion (CMP0 or CMP1) falls within such a range, the corresponding range comparator 736 may provide an active range compare output. Conversely, if a compare portion (CMP0 or CMP1) falls outside such a range, the corresponding range comparator 736 may provide an inactive range compare output.

Range compare outputs from first range compare circuits (728-0 to 728-N-1) may be prioritized by a first priority encoder 732 to generate a "one-hot" range code value RANGE CODEA. As but one very particular example, a first priority encoder 732 may receive sixteen range compare outputs and provide a sixteen bit range code value RANGE CODEA. However, while there may be multiple active range compare outputs, only one bit will be active (e.g., high) at any one time according to a priority inherent in a priority encoder. Such an arrangement may reflect a precedence of range values with respect to one another.

In this way, first priority encoder 732 may provide a first range code value RANGE CODEA, reflecting a highest priority match between compare portion CMP0 and ranges defined by first range compare circuits (728-0 to 728-N-1). In the same general fashion, a second priority encoder 734 may provide a second range code value RANGE CODEB, that reflects a highest priority match between compare portion CMP0 and ranges defined by second range compare circuits (730-0 to 730-N-1).

As shown in FIG. 7A, each range register 738 may store a lower range limit (BASEA[0] to BASEA[N−1] and BASEB[0] to BASEB[N−1]) as well as an upper range limit (BOUNDA[0] to BOUNDA[N−1] and BOUNDB[0] to BOUNDB[N−1]). Such limits are preferably programmable values that may be established by a user, or the like.

A sub-word enable circuit 712 can activate a sub-word compare enable signal PSIDE_B in the event a first range code value RANGE CODEA has a predetermined value. In this way, sub-word matching may be enabled by a range compare operation. In the particular example of FIG. 7A, a sub-word enable circuit 712 may include a side select register 740 and a comparator 742. A comparator 742 may compare a value provided by side select register 740 to a first range code value RANGE CODEA. If a match exists, a side select signal PSIDE_B can be activated, indicating a sub-word match mode of operation.

A value stored in a side select register 740 may be established by the hardware of a CAM device, but is preferably programmable.

A merge circuit 714 may merge all or a portion of a range code value (RANGE CODEA and/or RANGE CODEB) with a compare data value to generate a modified compare data value 704. In this way, a preclassifier circuit may insert a range code value into a compare data value that represents a range match for a portion of the compare data value.

In the particular example of FIG. 7A, a merge circuit 714 may include first shift circuits 744-0 and 744-1 and second shift circuits 746-0 and 746-1. First shift circuits (744-0 and 744-1) may receive range code values, and shift such values according to merge shift values. Thus, first shift circuit 744-0 may receive range code value RANGE CODEA and shift such a value leftward according to a merge shift value PUTA. A merge shift value PUTA may be derived from a first select value GETA, and essentially return a range code value RANGE CODEA to a position corresponding to the compare portion originally selected by a select MUX 716. In the same general fashion, first shift circuit 744-1 may return a range code value RANGE CODEB to a position corresponding to a compare portion selected by a select MUX 718.

Second shift circuits (746-0 and 746-1) may shift a size mask value according to merge shift value. In this way, a size mask value may be aligned with a corresponding range code value. Thus, in FIG. 7A, a second shift circuit 744-0 may receive size indication SIZEA, and shift such a value leftward according to a merge shift value PUTA. Likewise, second shift circuit 744-1 may receive a size indication SIZEB, and shift such a value leftward according to a merge shift value PUTB.

A merge circuit 714 may also include merge circuits (750-0 and 750-1) that may merge a compare data value with a shifted range code value, as masked by a size indication, to form a modified compare data value 704. As but one very particular example, a shifted range code value may form a merge code value MERGE CODE A. A shifted size indication value may form a merge mask MERGE MASK A. Such value may be combined to form an output merge value. Such an output merge value may be combined with a compare data value 702 in a merge circuit 752-0 to generate a modified compare data value.

The particular example of FIG. 7A shows a preclassifier circuit having two merge circuits (750-0 and 750-1).

Figure 7B:
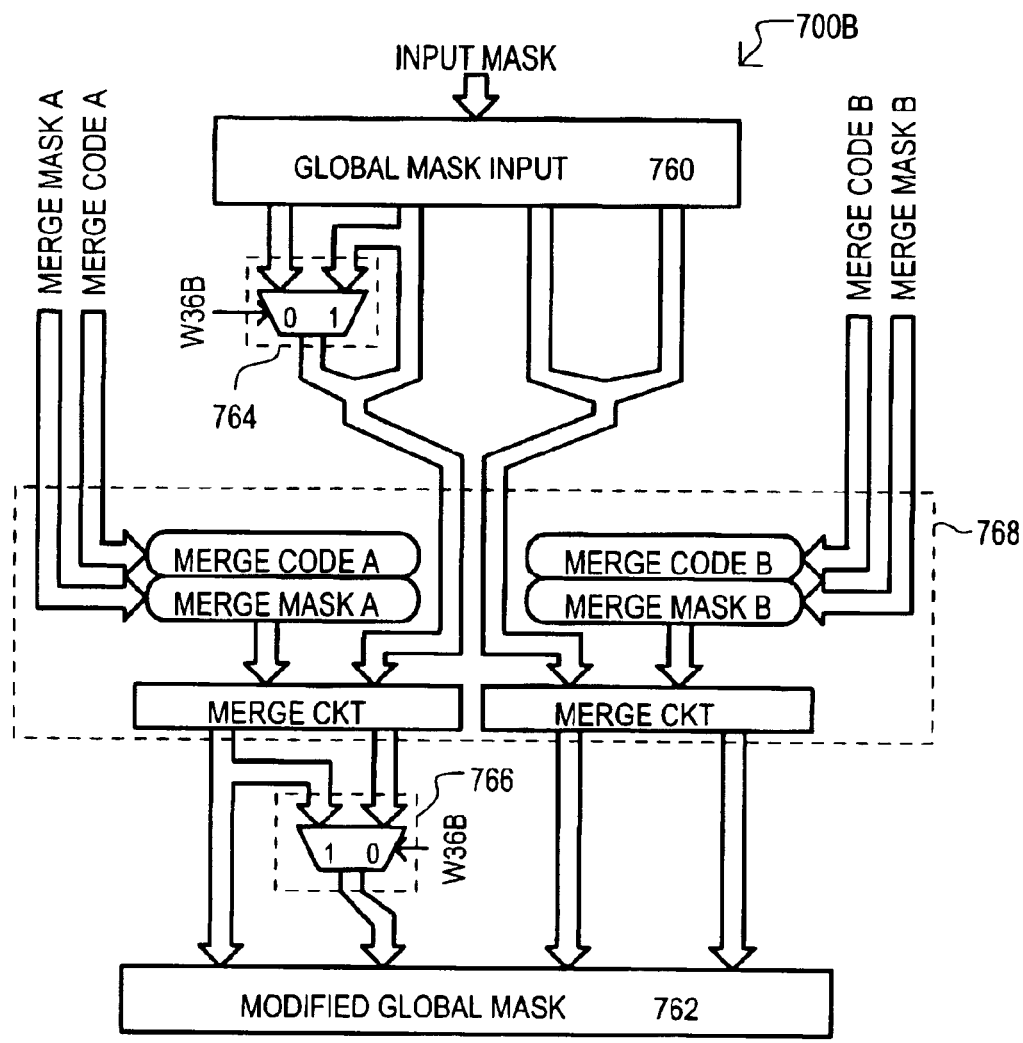
FIG. 7B is a block schematic diagram of a second section of the preclassifier circuit corresponding to the first section shown in FIG. 7A.

FIG. 7B is a block schematic diagram showing a second section of a preclassifier circuit 700B. A second section 700B may receive a global mask value 760 and provide a modified global mask value 762. A second section 700B may also receive merge mask values (MERGE MASK A and MERGE MASK B) and merge code values (MERGE CODE A and MERGE CODE B). Such values may be like those generated by first and second shift circuits (744-0, 744-1, 746-0 and 746-1) in FIG. 7A.

A second portion 700B may include a first mode MUX 764, a second mode MUX 766, and a mask merge circuit 768. A first mode MUX 764 may selectively output one of two portions of a global mask value according to a mode signal W36B. This arrangement may allow for masking on a sub-word basis.

A mask merge circuit 768 may include the same general components as merge circuit 714, thus a detailed description will be omitted. It can be seen that in the particular example of FIGS. 7A and FIG. 7B, that a mask merge circuit 768 may insert a masked range code value into global mask value to form a modified global mask value 762.

A second mode MUX 766 may selectively output one of two portions of a global mask value as modified by mask merge circuit 768. This arrangement may also allow for masking on a sub-word basis.

Figure 8:
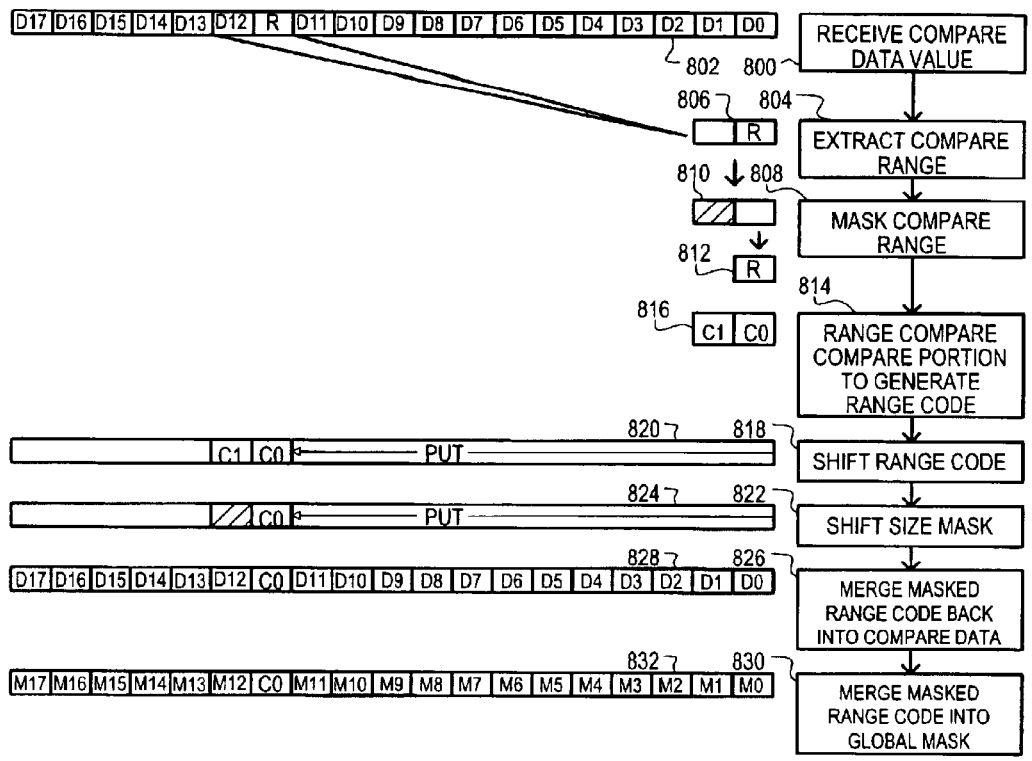
FIG. 8 is a diagram illustrating the operation of a preclassifier circuit like that shown in FIGS. 7A and 7B.
Figure 9:
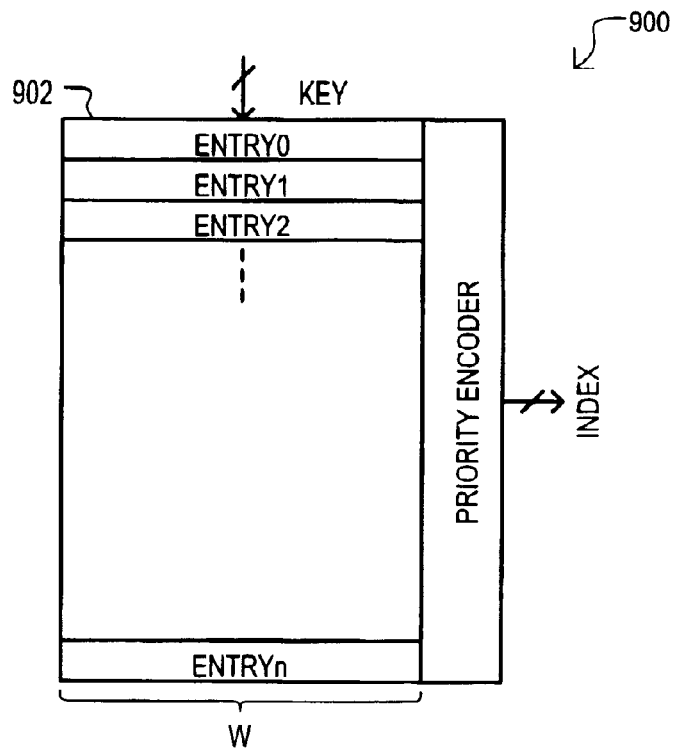
FIG. 9 is a block schematic diagram of a conventional CAM device.
Figure 10:
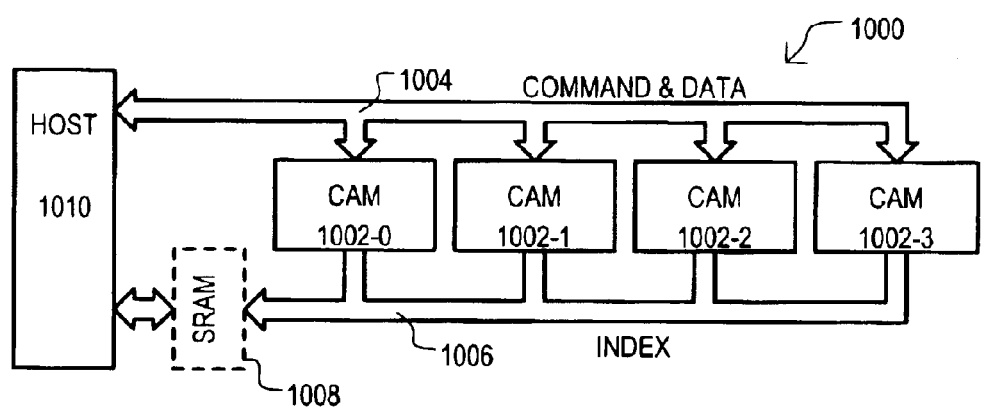
FIG. 10 is a schematic diagram of a conventional CAM based search engine system.

Referring now to FIG. 8, the operation of a preclassifier circuit, like that shown in FIGS. 7A and 7B, will now be described. FIG. 8 includes a flow diagram and a number of block diagrams illustrating how a modified compare data value may be formed from a compare data input value.

A preclassifier circuit may receive a compare data value 800. Such a compare data value is represented in FIG. 8 by data value 802. Data value 802 may include a number of fields D0 to D17. As but one very particular example, each of data fields D0 to D17 maybe 8-bits.

A preclassifier circuit may extract a compare range from a received compare data value 804. Such a compare range is shown as 806 in FIG. 8. A compare portion 806 may include a number of bits, all or a subset of which may be subject to a range compare operation. In FIG. 8 compare portion 806 includes a section "R" that includes bits that are to be range compared. As but one very particular example, a portion may include 16 bits, of which bits 0–7 are to be range compared, while bits 8–15 are to be excluded from a range compare operation.

A preclassifier circuit may mask a compare range to select appropriate bits for a range compare operation 806. FIG. 8 shows a mask 810 that may mask a portion of a compare range 806 to generate a compare portion 812. A masking portion is shown by hatching. Continuing with the particular example noted above, a mask 810 may mask bits 8–15 of a 16 bit compare range to arrive at an eight bit compare portion 812.

A preclassifier circuit may then range compare a compare portion to generate a range code value 814. All or a portion of a range code value 814 may be inserted into a compare data value to arrive at a modified compare data value. In the very particular example of FIG. 8, it is assumed that a range code value has included portions and excluded portions. An excluded portion may not be merged back into a compare data value to from a modified compare data value. In the example of FIG. 8, an excluded portion range code value 814 is represented by C1, while an included portion is represented by C0.

A preclassifier circuit may shift a range code value 818 in preparation of a merge operation. Such a shift operation can position a range code value in the same bit position as the compare range utilized to generate a range code value. A shifting of a range code value is represented in FIG. 8 by item 820. A shift amount is shown by shift value PUT.

A preclassifier circuit may also shift a mask value 822 in preparation of a merge operation. Such a shift operation can position a mask value in the same bit position as the compare range utilized to generate a range code value. A shifting of a range code value is represented in FIG. 8 by item 824. A shift amount can be the same as step (PUT).

A preclassifier circuit may then merge a masked range code into a compare data value to form a modified compare data value 826. A resulting modified compare data value is shown as item 828 in FIG. 8.

In this way, a preclassifier circuit may substitute a range code value (C0) for a compare portion (R) to generate a modified compare data value that can indicate if a compare portion (R) falls within one or more predetermined range.

A preclassifier circuit may also merge a masked range code into a global mask value to form a modified global mask value 830. A resulting modified compare data value is shown as item 832 in FIG. 8.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A content addressable memory (CAM) device, comprising:
   a data preclassifier circuit that receives an input data value and includes,
      at least one range compare circuit that compares at least one portion of the input data value to at least one predetermined range to generate a compare result value, and
      a merge circuit that substitutes at least a portion of the compare result value for the at least one portion of the input data value to form a modified data value.

2. The CAM device of claim 1, wherein:
   the input data value is selected from the group consisting of an entry data value for storage in a CAM entry, a search key value for comparison with CAM entry data values, and a mask value for masking selected bits from a compare operation between a search key value and CAM entry data values.

3. The CAM device of claim 1, further including:
   a mask register that provides mask values; and
   the input data value includes a mask value.

4. The CAM device of claim 1, further including:
   at least one range register that stores the at least one predetermined range.

5. The CAM device of claim 1, further including:
   a preclassifier bypass circuit that outputs the input data value when a target match signal has a first value and outputs the modified data value when the target match signal has a second value.

6. The CAM device of claim 5, further including:
   a compare circuit that compares an input target value to at least one CAM device target value to generate the target match signal.

7. The CAM device of claim 1, wherein:
   the at least one range compare circuit includes a plurality of range compare circuits that each compare a received input data value portion to a predetermined range to generate a single range compare result values.

8. The CAM device of claim 7, further including:
   a range priority encode that prioritizes the single range compare result values to generate the compare result value.

9. The CAM device of claim 8, wherein:
   the merge circuit includes
      a merge shift circuit that shifted the compare result value according to a shift value to generate a shifted compare result value, and
      a combine circuit that logically combines the shifted compare result value with the input data value to form the modified data value.

10. The CAM device of claim 1, wherein:
    the at least one range compare circuit includes an input select circuit that selects a portion of the input data value.

11. The CAM device of claim 1, further including:
    the input data value includes a mask value; and
    a first mask output circuit that outputs a received first mask value portion in a first mode and predetermined mask value in a second mode.

12. The CAM device of claim 11, further including:
    a second mask output circuit that outputs a received second mask value portion in the first mode and the predetermined mask value in the second mode.

13. The CAM device of claim 1, further including:
    the input data value includes a compare data value;
    the data preclassifier circuit provides an output compare data value; and
    a data output circuit that outputs a second portion of the output compare data value a first mode and fist portion of the output compare data value in a second mode.

14. A content addressable memory (CAM), comprising:
    CAM core; and
    a circuit that
       classifies an incoming search key according to predetermined criteria,
       modifies the incoming search key based on the predetermined criteria, and
       issues the modified search key to the CAM core.

15. The CAM of claim 14, wherein:
    the circuit classifies the incoming search key based on a comparison of at least a portion of the search key with at least one predetermined range.

16. The CAM of claim 14, wherein:
    the circuit classifies the incoming search key by generating an encoded value, and modifies the incoming search key by altering a portion of the search key according to the encoded value.

17. The CAM of claim 14, further including:
    a target mach circuit that compares a search target value to at least one CAM device target value to generate a target match indication; and
    the circuit selectively classifies the incoming search key according to the target match indication.

* * * * *